United States Patent [19]

Bonato

[11] Patent Number: 4,817,201
[45] Date of Patent: Mar. 28, 1989

[54] SINGLE SIDE BAND HARMONIC FREQUENCY CONVERTER, IN PARTICULAR FOR HIGH-FREQUENCY RECEIVING AND TRANSMITTING SYSTEMS

[75] Inventor: Paolo Bonato, Milan, Italy

[73] Assignee: GTE Telecommunicazioni, S.p.A., Milan, Italy

[21] Appl. No.: 927,486

[22] Filed: Nov. 6, 1986

[30] Foreign Application Priority Data

Dec. 30, 1985 [IT] Italy .................. 23404 A/85

[51] Int. Cl.[4] .............................................. H04B 1/26
[52] U.S. Cl. ................................ 455/325; 455/326; 455/330
[58] Field of Search ............... 455/203, 302, 317, 318, 455/319, 323, 325, 326, 330, 332; 375/77, 43; 333/117, 118, 124, 32, 120, 121

[56] References Cited

U.S. PATENT DOCUMENTS

| 2,248,250 | 7/1941 | Peterson | 178/44 |
| 2,872,647 | 2/1949 | Smith | 332/45 |
| 3,029,396 | 12/1955 | Sichak | 331/43 |
| 3,041,452 | 6/1962 | Robertson et al. | 455/319 |
| 3,233,194 | 2/1966 | Alford | 332/45 |
| 3,515,993 | 6/1970 | Merriam | 455/326 |
| 3,681,697 | 8/1972 | Moroney | 455/326 |
| 4,245,355 | 1/1981 | Pascoe et al. | 455/326 |
| 4,355,420 | 10/1982 | Ishihara | 455/330 |
| 4,485,488 | 11/1984 | Houdart | 455/330 |
| 4,603,435 | 7/1986 | Butler | 455/319 |

FOREIGN PATENT DOCUMENTS 1812957 8/1969 Fed. Rep. of Germany .
1591149 11/1970 Fed. Rep. of Germany .
2608939 6/1981 Fed. Rep. of Germany .

OTHER PUBLICATIONS

Pat. Absts. of Japan; vol. 1, #146 (E77); Nov. 26, 1977; p. 7547 E77; Pat. Pub. #52-86760; "Phase Difference Modulation Circuit."
Pat. Absts. of Japan; vol. 7, #40 (E159); Feb. 17, 1983; p. 1185 E159; Pat. Pub. #57-193106; "Image Cancellation Type Frequency Converter."

Primary Examiner—Benedict V. Safourek
Assistant Examiner—Curtis A. Kuntz
Attorney, Agent, or Firm—David N. Caracappa

[57] ABSTRACT

Two harmonic mixers arranged in parallel are connected to a first signal frequency gate and to a second local frequency gate by means of a single radiofrequency hybrid circuit in quadrature or by means of respective hybrid circuits of which one in quadrature and centered on the signal frequency and the other in phase, quadrature or opposition of phase and centered on the local frequency. Another intermediate frequency hybrid circuit in quadrature connects the two mixers to a third intermediate frequency gate and to a fourth gate closable on a termination. In this manner there is obtained a harmonic frequency conversion with image suppression.

18 Claims, 4 Drawing Sheets

SINGLE SIDE BAND HARMONIC FREQUENCY CONVERTER, IN PARTICULAR FOR HIGH-FREQUENCY RECEIVING AND TRANSMITTING SYSTEMS

BACKGROUND OF THE INVENTION

1. Field of the Invention

The present invention relates to a single side band harmonic frequency converter, in particular for high-frequency receiving and transmitting systems.

2. Description of the Related Art

Single side band converters are used advantageously both in transmission and in receiving to eliminate the filtering element which, in addition to making use of the range of operating frequencies less elastic, make the system decidedly more costly and cumbersome.

SUMMARY OF THE INVENTION

They consist basically of an image rejection mixer, which operates in combination with a local oscillator at frequency $F_e = F_s \pm F_i$ where $F_s$ is the frequency of the signal indicated and $F_i$ is the intermediate frequency of the receiving or transmitting apparatus.

A serious problem of known single side band converters is that as frequency rises it becomes difficult to make low cost steady local oscillators capable of delivering the necessary power for good mixer operation.

This problem can be partially solved through the use of harmonic mixers, also known, which are capable of operating with halved frequency local oscillators, i.e. equal to $\frac{1}{2}(F_s \pm F_i)$.

This requires introduction of filters with the resulting loss of the advantages tied to use of a conventional local oscillator.

In such a situation, the object of the present invention is to accomplish a single side band frequency converter, in particular for high-frequency receiving and transmitting systems (e.g. in the range of 10–18 GHz), which would unite the advantages of image rejection mixers and harmonic mixers without the drawbacks thereof.

In accordance with the invention said object has been achieved with a single side band harmonic converter employable for both receiving and transmitting characterized in that it comprises two harmonic mixers arranged in parallel, at least one hybrid radiofrequency circuit connecting each harmonic mixer with a first signal frequency gate and with a second local frequency gate and a hybrid intermediate frequency circuit in quadrature connecting each harmonic mixer with a third intermediate frequency gate and a fourth gate closable on a termination. As will be better explained below, the described association of two harmonic mixers and two or more hybrid circuits, radiofrequency and intermediate frequency respectively, enables the converter in accordance with the invention to operate with a single side band (i.e. with rejection or suppression of the image) by using a halved local frequency and hence, on the high frequencies, a less costly and cumbersome local oscillator.

Experimental results have shown that the converter exhibits characteristics (such as conversion losses, local oscillator pump level, image suppression degree, and insulation between local and radiofrequency oscillator) which are sparingly degraded in comparison with a conventional image rejection converter.

Summing up, the balance is clearly in favour of the converter in accordance with the invention as compared both with conventional image rejection converters and with harmonic converters without image rejection.

BRIEF DESCRIPTION OF THE DRAWING

The characteristics of the present invention will be made clearer by the description given below of some embodiments thereof illustrated as nonlimiting examples in the annexed drawings wherein.

DESCRIPTION OF THE PREFERRED EMBODIMENT

Figure 1:
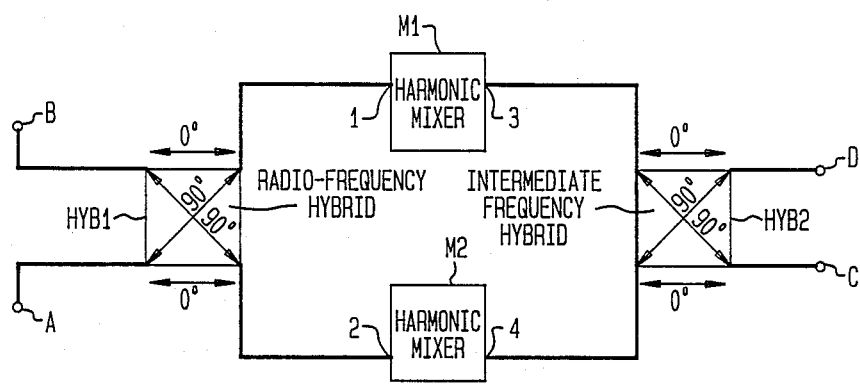
FIG. 1 shows diagramatically a first example of a converter in accordance with the invention.

In FIG. 1 is illustrated a single side band harmonic converter which comprises two identical harmonic mixers M1 and M2 in parallel. A first terminal 1 of the mixer M1 and a corresponding terminal 2 of the mixer M2 are connected to two gates A and B through a first 3 dB hybrid radiofrequency circuit in quadrature HYB1. A second terminal 3 of the mixer M1 and a corresponding terminal 4 of the mixer M2 are in turn connected to two other gates C and D through a second 3 dB hybrid intermediate frequency circuit in quadrature HYB2.

The converter of FIG. 1 can operate both for receiving and for transmitting.

In the first case, to gate A is applied a signal frequency voltage $v_s = V_s \cos w_s t$ and to gate B is applied a local frequency voltage $v_e = V_e \cos w_e t$ supplied by a local oscillator.

The local frequency can be such as to satisfy either of the following equations:

$$w_e = \tfrac{1}{2}(w_s + w_i) \quad \text{(a)}$$

$$w_e = \tfrac{1}{2}(w_s - w_i) \quad \text{(b).}$$

Due to the effect of the hybrid in quadrature HYB1 (selected in such a manner as to operate either in the frequency band around $F_s$ or in those around $F_e$) equation (a) causes in a known manner at terminal 1 of the mixer M1 a voltage $v_1$ given by the following expression:

$$v_1 = \frac{V_e}{\sqrt{2}} \cos w_e t + \frac{V_s}{\sqrt{2}} \cos(w_s t - 90°)$$

from which is derived at the terminal 3 of said mixer M1 a current $i_3$ expressed as follows $$i_3 = \frac{F}{2} \cos[2w_e t - (2w_e t - w_i t - 90°)] = \frac{F}{2} \cos(w_i t + 90°)$$

where F is a constant dependent upon the mixer M1.

At the terminal 2 of the mixer M2 is caused a voltage $v_2$ given by the following expression:

$$v_2 = \frac{V_e}{\sqrt{2}} \cos(w_e t - 90°) + \frac{V_s}{\sqrt{2}} \cos(w_s t)$$

from which is derived at the terminal 4 of said mixer M2 a current $i_4$ expressed as follows:

$$i_4 = \frac{F}{2} [\cos(2w_e t - 180° - (2w_e t - w_i t))] =$$

$$\frac{F}{2} \cos(w_i t - 180°) = -\frac{F}{2} \cos w_i t$$

By the effect of the hybrid in quadrature HYB2 there are consequently present at the outputs C, D the following currents:

$$i_c = \frac{F}{2\sqrt{2}} [\cos(w_i t + 90° - 90°) + (-\cos w_i t)] = 0$$

$$i_d = \frac{F}{2\sqrt{2}} [\cos(w_i t + 90°) + \cos(w_i t - 180° - 90°)] =$$

$$\frac{F}{\sqrt{2}} \cos(w_i t + 90°)$$

In other words, no intermediate frequency signal is present at the output C, which therefore can be connected to a termination while an intermediate frequency signal is present at the output D. This means that only one of the two side bands of the intermediate frequency signal is present at the output of the converter while the other one is suppressed.

From equation (b) is also derived the following expression:

$$v_1 = \frac{V_e}{\sqrt{2}} \cos w_e t + \frac{V_s}{\sqrt{2}} \cos(w_s t - 90°)$$

$$i_3 = \frac{F}{2} \cos[2w_e t - (2w_e t + w_i t - 90°)] =$$

$$\frac{F}{2} \cos(-w_i t + 90°) = \frac{F}{2} \cos(w_i t - 90°) = \frac{F}{2} \cos(w_i t - 90°)$$

$$v_2 = V_e \cos(w_e t - 90°) + V_s \cos(w_s t)$$

$$i_4 = \frac{F}{2} \cos[2w_e t - 180° - (2w_e t + w_i t)] =$$

$$\frac{F}{2} \cos(-w_i t - 180°) = \frac{F}{2} \cos(w_i t + 180°) = -\frac{F}{2} \cos w_i t$$

$$i_c = \frac{F}{2\sqrt{2}} \{\cos(w_i t - 90° - 90°) + [-\cos(w_i t)]\} =$$

$$-\frac{F}{\sqrt{2}} \cos w_i t$$

$$i_d = \frac{F}{2\sqrt{2}} \{\cos(w_i t - 90°) + [-\cos(w_i t - 90°)]\} = 0$$

In this case the situation is reversed, i.e. there is a signal of frequency $W_i$ on the output C, while there is no signal with frequency $W_i$ on the output D.

In transmitting, while at gate B there is still applied a local frequency voltage $v_e = V_e \cos w_e t$, it is necessary to distinguish between two hypotheses corresponding to the application of an intermediate frequency voltage $v_i = V_i \cos w_i t$ at gate C or at gate D (with the other gate connected to a suitable termination).

In the first case, i.e. with voltage $v_i$ applied to gate C, there are brought about at the terminals 1, 2, 3 and 4 the following situations:

$$v_3 = \frac{V_i}{\sqrt{2}} \cos(w_i - 90°)$$

$$i_1 = K \cos[2w_e t - (w_i t - 90°)] + K \cos[2w_e t + (w_i t - 90°)] =$$

$$K \cos(2w_e t - w_i + 90°) + K \cos(2w_e t + w_i t - 90°)$$

$$v_4 = \frac{V_i}{\sqrt{2}} \cos w_i t$$

$$i_2 = K \cos[2w_e t - 180° - w_i t] + K \cos[2w_e t - 180° + w_i t].$$

At the outputs A and B the following currents are therefore present:

$$i_a = \frac{K}{\sqrt{2}} [\cos(2w_e t - w_i t + 90° - 90°) + \cos(2w_e t +$$

$$w_i - 90° - 90°) + \cos(2w_e t - 180° - w_i t) + \cos(2w_e t -$$

$$180° + w_i t)] = \sqrt{2} K \cos(ww_e t + w_i t - 180°)$$

$$i_b = \frac{K}{\sqrt{2}} [\cos(2w_e t - w_i t + 90°) + \cos(2w_e t + w_i t - 90°) +$$

$$\cos(2w_e t - w_i t + -180° - 90°) + \cos(2w_e t + w_i t -$$

$$180° + -90°)] = \sqrt{2} K \cos(2w_e t - w_i t + 90°)$$

In other words, at the output A may be taken a high-beat signal $v_s = V_s \cos w_s t = V_s \cos(2w_e t + +w_i t)$ while at the output B may be taken a low beat signal $V_s = V_s \cos w_s t = V_s \cos(2w_e t - w_i t)$.

In the second case, i.e. with voltage $v_i$ applied to the gate D, the outputs are exchanged, giving $$i_a = \sqrt{2} K \cos(2w_e t - w_i t + 90°)$$

$$i_b = \sqrt{2} K \cos(2w_e t - w_i t + 180°)$$

Picking up the signal available at gate A obviously causes transmission of one single side band signal while the other side band is suppressed.

Figure 2:
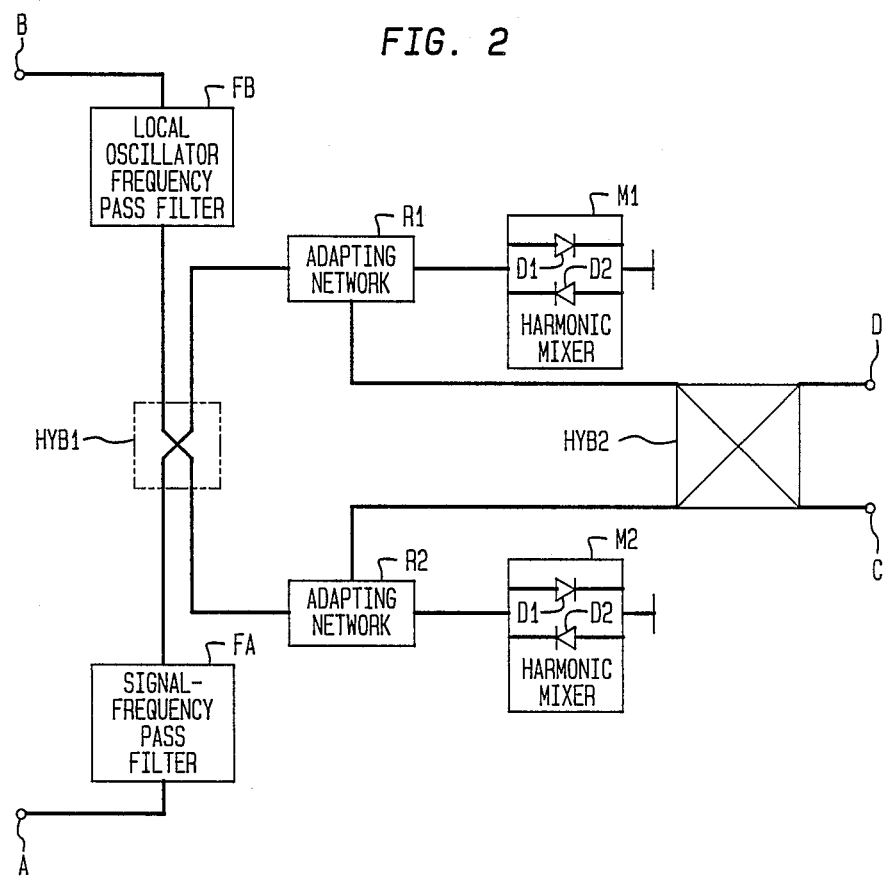
FIG. 2 shows the converter of FIG. 1 in a more detailed representation.

As can be seen from FIG. 2 each of the two harmonic mixers M1 and M2 is constituted in a known manner of two Schottky diodes D1 and D2 connected in antiparallel and has its own adaptation system R1 and R2 for the frequencies $f_s$ and $f_e$, with radiofrequency cold point for picking up the intermediate frequency $f_i$.

One problem of this converter concerns insulation between the radiofrequency gate A and the local frequency gate B. This insulation depends on the degree of adaptation of the diodes of the mixers and, if not perfect, can compromise the degree of image suppression.

To solve this problem the two gates A and B have filters FA and FB respectively capable of letting pass the signal frequency and the local frequency, blocking the local frequency and the signal frequency respectively.

Figure 3:
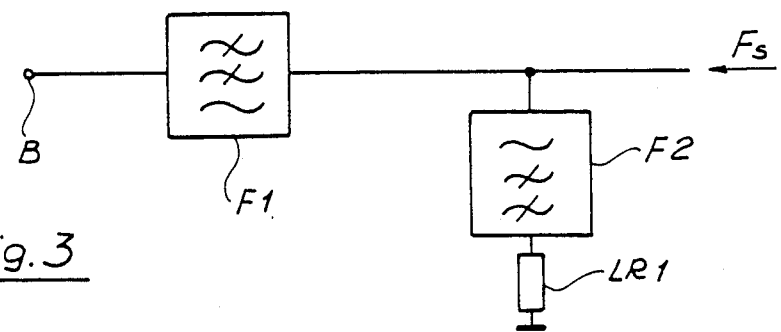
FIGS. 3–7 show construction details of the converter of FIGS. 1 and 2, FIGS. 8–10 show illustrative charts drawn up experimentally from a converter in accordance with FIGS. 1 and 2.

A representation of the filter FB is given in FIG. 3 which shows it made up of a low-pass filter F1 toward the low frequency $F_e$ and a high-pass filter F2 with resistive line LR1 between the high frequency $F_s$ and earth. As a result, the local frequency $F_3$ can pass freely through the gate B to the hybrid HYB1, while the frequency $F_s$, both in receiving and transmission, cannot reach said gate B because it is blocked by the filter F1 and short-circuited to earth by the filter F2.

Figure 4:
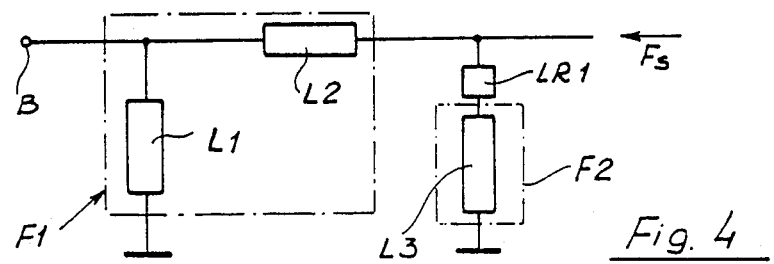

In more detail, the filter FB can be made as shown in FIG. 4, i.e. with the low-pass filter F1 made up of two sections of line L1 and L2 and the high-pass filter F2 made up of a section of line L3 in series with the resistive line LR1. Said resistive line LR1 has the function of dissipating power, preventing reflexion of the frequency $F_s$.

Figure 5:
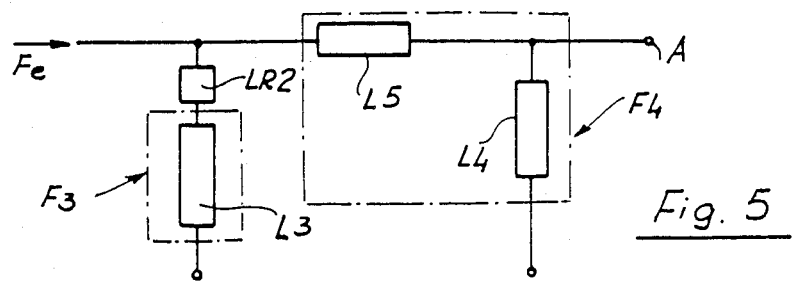

The filter FA can be made in a similar manner, as shown in FIG. 5, i.e. with a low-pass filter F3 formed of a section of line L3 with an added resistive line LR2 between the frequency $F_e$ and earth and a high-pass filter F4 formed of two sections of line L4 and L5 to the frequency $F_s$.

Figure 6:
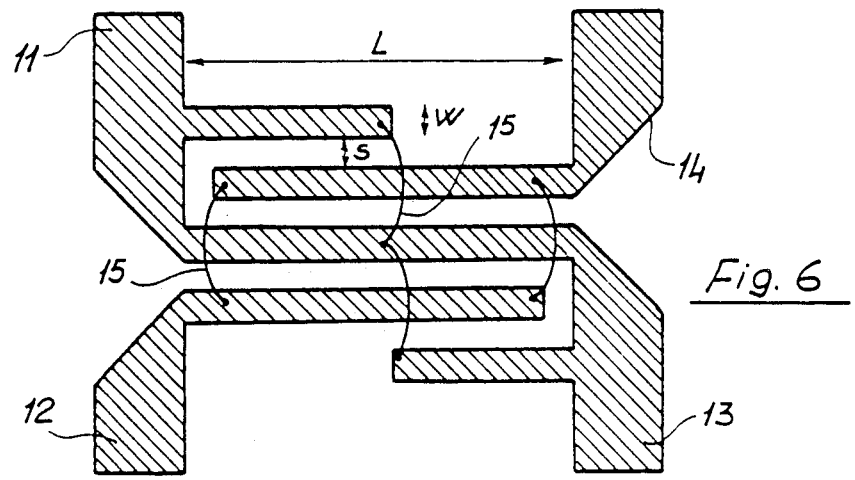

For proper operation of the converter, the making of the hybrid circuit 3 dB in quadrature HYB1 operating at the two frequencies $F_s$ and $F_e$ is of considerable importance. In this case it is necessary to employ a hydrid capable of covering two frequency bands distant one octave, as this is the normal distance between the two frequencies (approximately 11 GHz and approximately 5.5 GHz respectively). For this purpose there is provided a Lange inyterdigited coupler such as the one illustrated in FIG. 6 wherein 11 indicates the input, 12 indicates the coupled output, 13 indicates the direct output, and 14 the insulated output. The width W, the distance S and the length L of the various coupled strips S1–S5, together with the diameter of the electric connecting wire 15 and the thickness of the conducting layer are selected in such a manner as to secure a proper balance at the band ends (distant one octave), obviously at the expense of the centre band balance, which is of no interest for this application.

Figure 7:
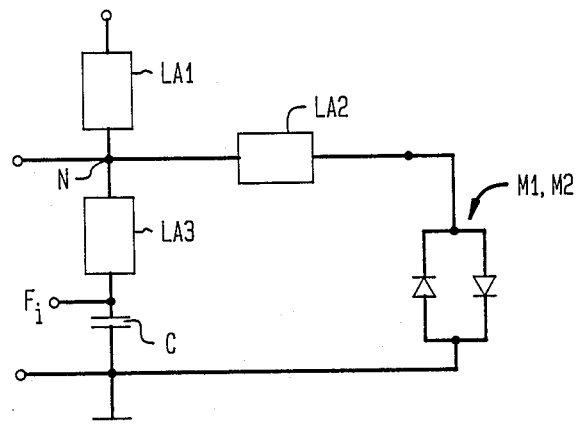

A suitable adaptation system R1, R2 is illustrated in FIG. 7 and is composed of three sections of line LA1, LA2, LA3 of appropriate length and characteristic impedance respectively interposed between an open circuit and a common node N connected to the hydrid HYB1, between said common node and the mixer M1, M2 and between said common node and earth (together with a capacitance C). The intermediate frequency is present between the line LA3 and the capacitance C.

Two experimental prototypes without filters FA and FB are made respectively in the frequency ranges from 10 to 12 GHz and from 17.2 to 18.2 GHz to verify the operating principle of the image suppression harmonic converter in accordance with the invention.

Figure 8:
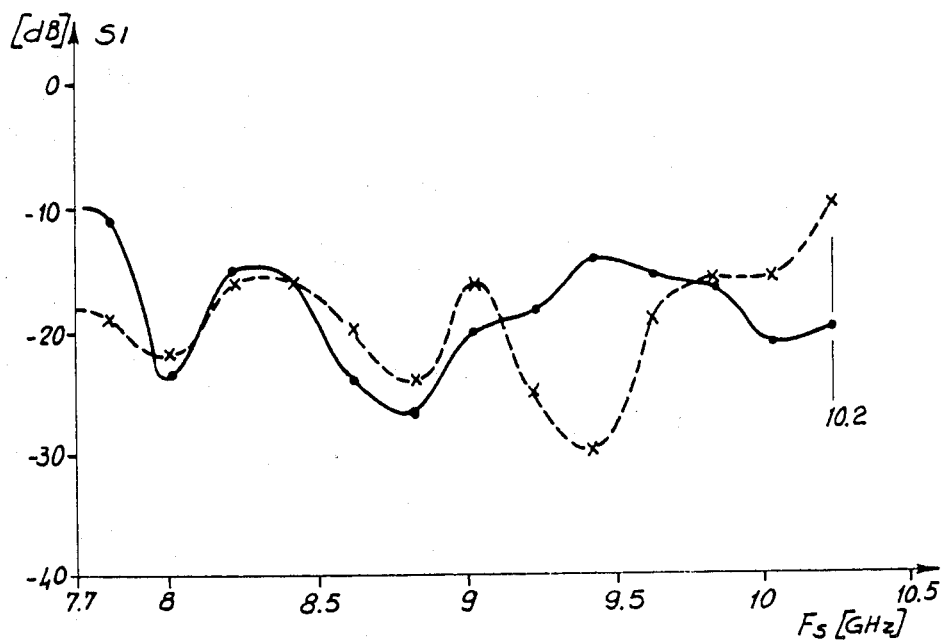
Figure 9:
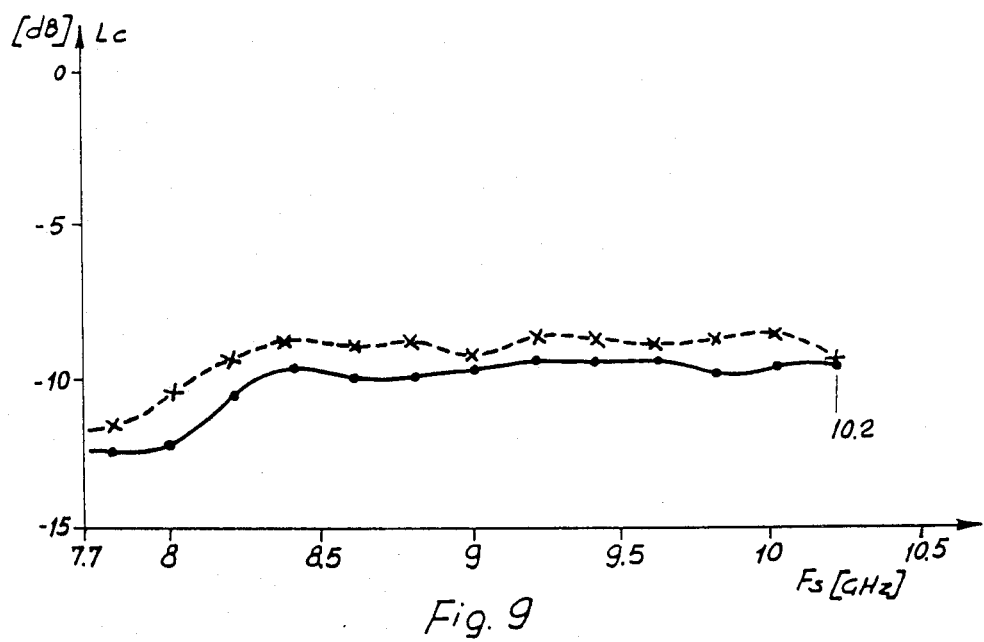

The first prototype was made on alumina and the measurements taken during use as a receiving converter gave the results illustrated in the charts shown in FIGS. 8 and 9, indicating respectively the variations in the image suppression SI and in the conversion losses Lc on the basis of the frequency $F_s$ for two different powers of the local oscillator $P_e=2.8$ dBm (broken line curve) and $P_e=4.5$ dBm (unbroken line curve). The results are clearly positive.

Measurements taken during use as a transmission converter also gave positive indications.

Figure 10:
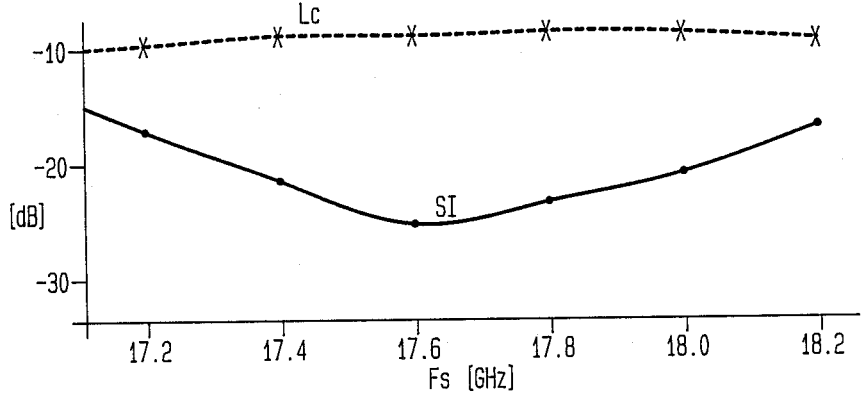

The second prototype was made on quartz and, when used in receiving, supplied data for the two charts SI and Lc of FIG. 10, considered for $P_e=0$ dBm. The results again proved favourable.

Figure 11:
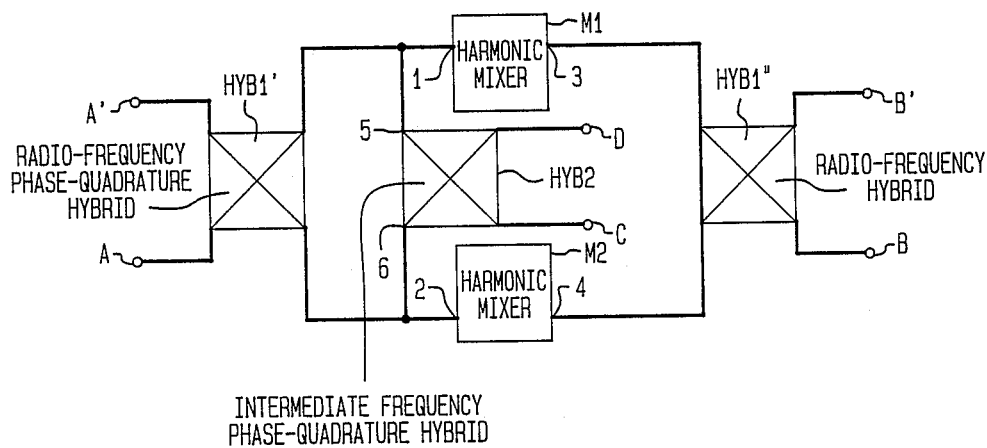
FIG. 11 shows a second example of a converter in accordance with the invention.

FIG. 11 shows a second use of the converter in accordance with the invention, which comprises two harmonic mixers M1 and M2 connected to gates A and A' at signal frequency $F_s$ by means of a hybrid circuit HYB1' at 3 dB in signal frequency quadrature and at gates B and B' at local frequency $F_e$ by a separate hybrid local frequency circuit HYB1'' on 3 dB with local frequency, indifferently in phase, in quadrature or in phase opposition. Another 3 dB hybrid circuit in phase quadrature with intermediate frequency HYB2 connects said mixers M1 and M2 to other gates C and D.

This solution is advantageous from the viewpoint of use of the two hybrid circuits HYB1' and HYB1'' centred on well-defined and separate frequencies respectively, but on the other hand calls for another hybrid with the associated cost and encumbrance added.

As concerns receiving operation, there are the following two cases:

$$w_e = \tfrac{1}{2}(w_s + w_i) \qquad (a)$$

$$w_e = \tfrac{1}{2}(w_s - w_i) \qquad (b).$$

In the first case, assuming the use of a hybrid HYB1'' in phase, there are the following expressions at the various terminals of the converter:

$$v_1 = \frac{V_e}{\sqrt{2}} \cos(w_e t) + \frac{V_s}{\sqrt{2}} \cos(w_s t - 90°)$$

$$i_5 = \frac{F}{2} \cos[2 w_e t - (2w_e t - w_i t - 90°)] =$$

$$\frac{F}{2} \cos(w_i t + 90°)$$

$$v_2 = \frac{V_e}{\sqrt{2}} \cos(w_e t) + \frac{V_s}{\sqrt{2}} \cos w_s t$$

$$i_6 = \frac{F}{2}[\cos(2w_e t - (2w_e t - w_i t))] = \frac{F}{2} \cos w_i t$$

$$i_c = \frac{F}{2\sqrt{2}}[\cos(w_i t + 90° - 90°) + \cos w_i t] = \frac{F}{\sqrt{2}} \cos w_i t$$

$$i_d = \frac{F}{2\sqrt{2}}[\cos(w_i t + 90°) + \cos(w_i t - 90°)] = 0$$

In the second case, again using a hybrid HYB1'' in phase, we have:

$$v_1 = \frac{V_e}{\sqrt{2}} \cos w_e t + \frac{V_s}{\sqrt{2}} \cos(w_s t - 90°)$$

$$i_5 = \frac{F}{2} \cos[2w_e t - (2w_e t - w_i t - 90°)] =$$

$$\frac{F}{2} \cos(-w_i t + 90°) = \frac{F}{2} \cos(w_i t - 90°)$$

$$v_2 = \frac{V_e}{\sqrt{2}} \cos(w_e t) + \frac{V_s}{\sqrt{2}} \cos w_s t$$

$$i_6 = \frac{F}{2} \cos[2w_e t - (2w_e t - w_i t)] = \frac{F}{2} \cos(-w_i t) =$$

$$\frac{F}{2} \cos w_i t$$

$$i_c = \frac{F}{2\sqrt{2}}[\cos(w_i t + 90° - 90°) + \cos w_i t)] = 0$$

$$i_d' = \frac{F}{2\sqrt{2}} [\cos(w_i t + 90°) + \cos(w_i t - 90°)] = \frac{F}{\sqrt{2}} \cos(w_i t - 90°)$$

From the expressions associated with the currents $i_c$ and $i_d$ it can be noted that at the intermediate frequency output C and D it is possible to pick up a signal placed on a side band, while the other side band, i.e. its image, is suppressed.

If the hybrid HYB1″ were in phase opposition the results would not change. But if it were in quadrature we would have the expressions previously set forth for the embodiment of FIG. 1. When operating in transmission with hybrid HYB1″ in phase quadrature there are obtained the same expressions already set forth for the embodiment example given in FIG. 1.

With hybrid HYB1″ in phase or in phase opposition there are obtained on the other hand formally identical results unless there is a +90° phase rotation of the output signals.

The converter of FIG. 11 repeats therefore the results of the one represented in FIG. 1.

I claim:

1. A single side band harmonic frequency converter, comprising:
   two harmonic mixers arranged in parallel, each mixer including a pair of Schottky diodes connected in parallel and with opposite polarity, and an impedance matching system;
   a single radiofrequency hybrid circuit with phase quadrature outputs connecting each harmonic mixer with a first signal frequency gate and with a second local frequency gate wherein said radiofrequency hybrid circuit includes inputs for receiving a signal frequency input signal from the first gate, and a local frequency input signal from the second gate; and
   an intermediate frequency hybrid circuit with phase quadrature outputs connecting each harmonic mixer with a third intermediate frequency gate and a fourth gate; wherein:
   said impedance matching system includes a common node coupled to said radiofrequency hybrid circuit, a first open-circuit line section having a first terminal coupled to said common node, a second line section coupled between said Schottky diodes and said common node, a third line section coupled between said common node and said third intermediate frequency gate, and a capacitance coupled between said third intermediate frequency gate and ground.

2. The converter in accordance with claim 1 wherein said radiofrequency hybrid circuit comprises an interdigited Lange coupler with dimensions such as to present an optimal balance at the signal frequency and the local frequency.

3. The converter in accordance with claim 1 further comprising:
   a first band-pass filter coupled between said radiofrequency hybrid circuit and said first signal frequency gate for passing the signal frequency input signal and blocking the local frequency input signal; and
   a second band-pass filter coupled between said radiofrequency hybrid circuit and said second local frequency gate for passing the local frequency input signal and blocking the signal frequency input signal.

4. The converter in accordance with claim 3 wherein said first band-pass filter comprises a low-pass filter and a resistive line between said radiofrequency hybrid circuit and ground, and a high-pass filter between said radiofrequency hybrid circuit and said first signal frequency gate.

5. The converter in accordance with claim 4 wherein said low-pass filter comprises a line-section.

6. The converter in accordance with claim 4 wherein said high-pass filter comprises two line-sections.

7. The converter in accordance with claim 3 wherein said second band-pass filter comprises a high-pass filter and a resistive line between said radiofrequency hybrid circuit and ground, and a low-pass filter between said radiofrequency hybrid circuit and said second local frequency gate.

8. The converter in accordance with claim 7 wherein said high-pass filter is made up of a line-section.

9. The converter in accordance with claim 7 wherein said low-pass filter is made up of two line-sections.

10. A single side band harmonic frequency converter, comprising:
    two harmonic mixers arranged in parallel, each mixer including a pair of Schottky diodes connected in parallel and with opposite polarity, and an impedance matching system;
    a single radiofrequency hybrid circuit with phase quadrature outputs connecting each harmonic mixer with a first signal frequency gate and with a second local frequency gate, wherein said radiofrequency hybrid circuit includes inputs for receiving a signal frequency input signal from the first gate, and said local frequency input signal from the second gate; and
    an intermediate frequency hybrid circuit with phase quadrature outputs connecting each harmonic mixer with a third intermediate frequency gate and a fourth gate;
    a first band-pass filter coupled between said radiofrequency hybrid circuit and said first signal frequency gate for passing the signal frequency input signal and blocking the local frequency input signal; and
    a second band-pass filter coupled between said radiofrequency hybrid circuit and said second local frequency gate for passing the local frequency input signal and blocking the signal frequency input signal.

11. The converter in accordance with claim 10 wherein said impedance matching system comprises:
    a common node coupled to said radiofrequency hybrid circuit;
    a first open-circuit line section having a first terminal coupled to said common node;
    a second line section coupled between said Schottky diodes and said common node;
    a third line section coupled between said common node and said third intermediate frequency gate; and
    a capacitance coupled between said third intermediate frequency gate and ground.

12. The converter in accordance with claim 10 wherein said radiofrequency hybrid circuit comprises in interdigited Lange coupler with dimensions such as to present an optimal balance at the signal frequency and the local frequency.

13. The converter in accordance with claim 10 wherein said first band-pass filter comprises a low-pass filter and a resistive line between said radiofrequency hybrid circuit and ground, and a high-pass filter between said radiofrequency hybrid circuit and said first signal frequency gate.

14. The converter in accordance with claim 13 wherein said low-pass filter comprises a line-section.

15. The converter in accordance with claim 13 wherein said high-pass filter comprises two line-sections.

16. The converter in accordance with claim 10 wherein said second band-pass filter comprises a high-pass filter and a resistive line between said radiofrequency hybrid circuit and ground, and a low-pass filter between said radiofrequency hybrid circuit and said second local frequency gate.

17. The converter in accordance with claim 16 wherein said high-pass filter is made up of a line-section.

18. The converter in accordance with claim 16 wherein said low-pass filter is made up of two line-sections.

* * * * *